United States Patent [19]
Leveriza et al.

[11] Patent Number: 4,764,247
[45] Date of Patent: Aug. 16, 1988

[54] SILICON CONTAINING RESISTS

[75] Inventors: Carina T. Leveriza, Milpitas, Calif.; Russell A. Morgan, Eindhoven, Netherlands

[73] Assignee: Syn Labs, Inc., Sunnyvale, Calif.

[21] Appl. No.: 27,422

[22] Filed: Mar. 18, 1987

[51] Int. Cl.$^4$ .................. B44C 1/22; B29C 37/00; C03C 15/00; C03C 25/06
[52] U.S. Cl. .................. 156/643; 156/646; 156/659.1; 156/668; 156/904; 427/43.1; 428/447; 430/296; 430/270; 430/313
[58] Field of Search .................. 156/643, 646, 659.1, 156/662, 668, 904; 427/43.1; 430/296, 313, 270, 281, 285, 286, 287; 428/447

[56] References Cited

U.S. PATENT DOCUMENTS 4,551,418 11/1985 Hult et al. .................. 156/904 X
4,657,843 4/1987 Fukuyama et al. .................. 156/643 X Primary Examiner—William A. Powell
Attorney, Agent, or Firm—Harry A. Pacini

[57] ABSTRACT

The fabrication of improved semiconductor devices having photoresist materials in the form of silicon containing polystyrene copolymers of a halomethylstyrene and an alkylsilylstyrene and the resulting improved semiconductor wafer device containing silicon prior to etching; the resulting resist having reduced resist erosion and improved plasma resiliency.

18 Claims, No Drawings

SILICON CONTAINING RESISTS

BACKGROUND OF THE INVENTION

This invention relates to the fabrication of improved semiconductor devices and to improved photoresist materials used in the production of semiconductor devices. Also included is the process for preparing improved patterned resist on a substrate, the improved resist polystyrene polymer containing silane, improved photoresist material as a polystyrene copolymer containing silicon and the semiconductor wafer device containing silicon and the semiconductor wafer device having on its surface a photoresist containing silicon in its polymer matrix with the net result of the reduction of resist erosion.

DESCRIPTION OF THE PRIOR ART

The invention is directed to reduced erosion of developed irradiated negative or positive resists to produce a patterned image which is substantially undistorted from the initial pattern prior to the development. Photolithography is a well-known technique used during production of semiconductor devices such as monolithic integrated circuits. In photolithography, a coating of a photosensitive lacquar (photoresist) is deposited on a semiconductor wafer, and exposed through a photomask to a strong irradiation source, such as a UV light source, an electron beam, x-rays or plasma. The photoresist is then developed with a liquid developer which depending upon the negative photoresist dissolves the unexposed (mask covered) areas.

An oxidized silicon slice is coated with a film of photosensitive resist, which when exposed to a strong irradiation source through a mask bearing the pattern required for the first diffusion stage. Upon development, windows are opened in the resist film. In positive-working resist films, windows appear where the film has been exposed to the irradiation source.

When narrow lines, especialy lines less than one um in width, are developed in resists, there is a pronounced tendency for the lines and edges to undergo a characteristic deformation of the pattern profile. In positive and negative resists the profile developer undercuts or otherwise affects of the edges. Hence the profiles of developed patterns do not usually conform exactly to the beam profile. The profiles of developed patterns do not conform to the incident beam of irradiation, whether convergent or parallel. It is believed electron scattering occurs within the resist and back from the substrate. The resist reacts to the scattered electron as well as to the primary beam. The net result being the formation of exposed patterns with sloping edges, and some loss of resolution. Thus the result is an undercutting effect in the resists.

Resist profiles erode during plasma etching because of the ion and free radical components of etching in a planar reactor. The erosion of resist during plasma etching can cause loss of line width and, in severe cases, etching of the film surface. Good resolution at an acceptable thickness of the resist masks can be achieved by using bi- and tri-level masking methods. However, both of these methods require more complex processing than directly printed resists and hence these methods are avoided if at all possible.

Depending upon the particular operating conditions employed, the sensitivity of the resist will dictate acceptable useable resist material. The energy of the radiation also dictates the nature of the resist material, generally less sensitive resist material is needed as the energy source increases. The ability to accept the loss of some proportion of the film after development also will dictate the sensitivity of the resist material. Also the method of calculation can influence the result. Molecular weight distribution can also affect sensitivity and the general performance of electron resists.

Negative electron resists have used polymer type such as styrene, methyl-cyclo-siloxane (PMCS), vinyl-cyclo-siloxane (PVCS), PMCS/silylene phosphate, PVCS/silylene phosphate, epoxidized butadiene or isoprene, glycidyl methacrylate and copolymer with ethyl acrylate, diallyl orthophthalate, maleic anhydride-co-vinyl ether half esters. Crosslinking reactions within the irradiated polymer type is highly desirable. Some crosslinking is spontaneous with the irradiation. Poor resolution and contrast are negative aspects of such spontaneous crosslinking.

M. Hatzakis, *J. Electrochem. Soc.* 116 1969, 1033, has used cross-linked methacrylate positive-working resist to achieve completely insoluble positive resists. Metal conductor patterns were defined in this manner. The resist was introduced to facilitate operation of the "lift-off" technique. In this procedure a positive-working resist film is exposed to an electron pattern and developed to produce windows corresponding to the metallistic pattern. A metal film is then evaporated over the whole surface of the substrate. When the resist film is dissolved away, metal on it is also removed, leaving the desired metal pattern on the substrate. Success of this prior art method depends upon producing and maintaining in the resist, an undercut profile, so that a discontinuity exists between the metal film over the resist and that in the windows. The cross-linked resist of the prior art consists of methacrylate polymer chains, cross-linked by carboxylic acid anhydride groups. When exposed to irradiation by electrons, the bonds between the anhydride cross-link and the main polymer chain are broken. Linear structure is restored to the irradiated copolymer, and it becomes soluble in organic solvents. These regions are dissolved away, leaving on the substrate the unirradiated copolymer which is still cross-linked and forms a positive image. Such cross-linked polymethylmethacrylate polymer will resist high temperatures. However, this procedure has produced inconsistent results and ability to resolve fine detail is inadequate.

A study of resist erosion in chlorine and carbon tetrachloride plasmas revealed that the more aromatic and cross-linked the resist became the slower the resist erosion rate. Electron beam bombardment of a resist mask at high dose levels prior to plasma etching produces a highly cross-linked resist which has been shown to halve the erosion rate compared to a conventional resist mask when etched in a chlorine gas or carbon tetrachloride plasma at 300 mtorr pressure and 380 kHz. However, the reduction in resist erosion during carbon tetrafluoride and carbon tetrafluoride/oxygen—plasmas etching is considerably smaller. The reduction of resist erosion by half is insufficient for many processes and hence an alternative more effective method is needed to reduce mask loss during plasma etching. When some organic materials are irradiated by electrons, the first event which occurs generally is believed to be the expulsion of an electron from some bond within the molecule, forming initially a radical ion. The detail of what happens after this is not well understood, but the overall chemical changes can occur in all materials. In a given material, one of these changes always predominates determining the net result.

First, the radical ions or fragments produced from this may join together to form larger molecules having higher molecular weights. Inorganic polymers, the net effect is the formation of chain-like molecules linked together in a covalent network. This is called cross-linking. Alternately, the radical ions may break down further. In polymers, the long chain molecules are broken down to shorter chains of lower molecular weight. With changes in molecular weight there are corresponding changes in physical properties. Recent technology utilizes the particular change in solubility characteristics. Hence, if the resist film on a substrate is irradiated with electrons, the resist polymer can become (1) cross-linked and with a corresponding solubility increase. Crosslinking is desirable in resist polymers as it confers rigidity upon the polymer, and it will tolerate high temperatures without deforming.

There is continually a demand for finer and more complicated patterns. There is a limit in the pattern forming techniques using ultraviolet light and light sensitive materials. Therefore new pattern forming techniques are highly desirable. Practical development and application using electron beams and electron beam sensitive materials, X-rays and X-ray sensitive materials or plasma and plasma sensitive materials is considered herein. Accordingly, to employ such techniques there can be obtained finer patterns and pattern accuracy is hoped for.

With regard to the radiation sensitive materials, those having superior sensitivity are desirable and hence promoted as required. To attain a high pattern accuracy, moreover, it is necessary to provide materials which are superior in contrast. In addition, various other conditions are required of radiation sensitive materials such as operationability and resiliency; e.g. thin film formation, film quality, adhesion of the coating to the substrate, as well as, thermal stability and etch-resistance, and shelf-life of the product.

Therefore, there have been proposed very radiation sensitive materials for the pattern formation using electron beams and x-rays. However, a material which satisfies the above-mentioned conditions, particularly sensitivity, contrast and resiliency have not been known or disclosed. Polysiloxane with a vinyl group attached to a silicon atom in the main chain is known as a material for pattern formation using an electron beam. However, since the main chain is a nonorganic i.e. an inorganic, chain, such polysiloxane is inferior in its adhesion to substrates, and the resulting pattern is not well defined.

Further, conventional polymer contains vinyl groups, show that an attempt to form a pattern at high speed results in a tendency in lowering of the resolution and the pattern formed therein is inferior in accuracy. Further, such polymers have the disadvantage that an attempt to increase sensitivity and resiliency causes a lowering of stability, and the performance of the resist thus formed is deformed during storage and that they are easily adversely affected by visible rays.

In the instance of polyimide resist polymer, the addition of metallic elements to the resist polymer is one method of reducing mask loss during plasma etching. Cross-linking resist marks is another method of lowering mask erosion. This is not always possible as in the instance of polyimide resist polymers. For example, plasma etching of polyimide resist mask causes 15 percent faster etching. Electron bombardment produces a marginal improvement in etching selectivity. Additionally, on the bond breaking process from the electron bombardment occurs in the exposed polyimide polymer resist mask. The etch selectivity between resist and polyimide can be improved by silylation of the resist mask. The prior art resists are usually Novolac based polymers containing non-steric hindered hydroxyl groups, which can be silylated. This procedures an Si-O matrix in the mask during oxygen-plasma etching and reduces the resist erosion. Silylation of Novolac resists is a difficult process involving the use of hazardous chemicals such as tetrachlorosilane or tetramethylsilane.

British Patent specification No. 2154330 discloses introduction of silicon into the photoresist to increase the resistance of the photoresist to plasma etching. Silicon is introduced into the conventional photoresist material, Novalacs, after it has been deposited on a semiconductor wafer.

Novolac resists are formed by the reaction of phenol and/or cresols with formaldehyde. Novalac polymers which have sterically non-hindered hydroxyl groups can be silylated with the active hydrogens of the phenol groups replaced by silicon. The silicon is in the form of $—SiX_3$, where X is $—CH_3$(methyl) or $—Cl$(Chloro), for example.

U.S. Pat. No. 4,301,231 discloses the use of vinyl silyl or silyl vinyl groups within the polymer molecule. Two methods are taught, one method is to prepare a monomer having a vinyl silyl group within the molecule and having a polymerizable group other than the vinyl silyl group. The other method for preparing the negative resist materials utilizes the combination of a polymer having a reactive group X with a compound having a reactive group Y and containing a vinyl silyl group. In U.S. Pat. No. 4,301,231 the nature of the vinyl silyl group is such that the silicon atom (Si) and vinyl group ($CH=CH_2$) are separated by at least one monovalent organic group other than a vinyl group.

It is an objective of this invention to overcome the various difficulties in resist materials discussed herein above.

It is another object of this invention to provide new resist materials useful for ultrafine pattern generation on exposure to high energy radiation such as electron beam, x-ray or plasmas.

Another object is to provide resist material with improved plasma resiliency.

Another object of this invention is to provide an improved resist material having superior selectivity when exposed to radiation sources in the etching process.

Also an object of this invention is to provide a semiconductor wafer having deposited on its surface a photoresist molecule which contains silicon.

By employing the techniques and disclosure of the instant invention an ultrafine pattern can be obtained by casting a resist material onto a substrate and exposing the formed coating to radiation through a predetermined pattern to generate a latent image, followed by treatment with a solvent and dissolving away the unexposed portion.

The silyl group-containing-polymers which constitute the resist materials of this invention are solvent soluble and have good film forming properties. A good resist should have in addition to good film and coating properties, the capability of fine line definition using both optical and electron beams exposure methods. The exposure time should be short and once the pattern has been defined on the resist material it should survive the plasma process, i.e. have a low plasma erosion rate. The average molecular weight of the silyl containing styrene copolymer is probably not less than 2000 and not more than 1,000,000. The negative resist material is prepared from copolymerization of two monomers principally—trimethylsilylstyrene and chloromethylstyrene.

The polychloromethylstyrene system has an improved sensitivity to the electron beam. Whereas, polymethylstyrene resists can give good resolution using electron beam exposure with long exposure times. The high glass transistion temperature is exploited to reduce the swelling of cross-linked polymer chains. Polymethylstyrene has a low plasma erosion rate because of its higher aromatic and cross-linked matrix. However, polymethylstyrene has very low sensitivity to deep UV radiation. The introduction of halogens, for example, chlorine into the methyl group of polymethylstyrene improves the sensitivity. The addition of chlorine to the methyl groups need be only about five percent to produce this beneficial change in sensitivity. The chlorine containing polymethylstyrene can produce good images in deep UV exposure producing 1 um lines with $22 > mJcm^{-2}$ of energy.

By halogenated or halomethyl styrene is meant a methylstyrene substituted in the methyl moiety with at least one halogen atom selected from the group consisting of chlorine, bromine and iodine.

Polytrimethylsilylstyrene as a resist has been found to behave similarly to polymethylstyrene. When copolymerized with about five percent of chloromethylstyrene the sensitivity of the polytrimethylsilylstyrene is improved, this is based on the change in the electron density of the aromatic system. The change of substituents on the aromatic ring will affect the electron density and therefore the reactivity. The presence of the silicon can contribute to the electron ring density by using the outer d-orbital in partial pi-bond formation. Since polytrimethylsilylstyrene has a silicon content, it will have a lower erosion rate than Novolac and poly-chloromethylstyrene resists in oxygen plasmas in a chlorine plasmas.

The negative resist materials of the invention are used in the fabrication of patterns in the following manner:

The copolymer is dissolved in a suitable solvent to prepare a polymer solution. In this case, the solvent to be used is selected according to the properties of the polymer. For the present examples, the solvent used is xylene (mixed). Fourteen to twenty percent solids are formulated in the solvent. The polymer solution is filtered through a filter with a pore size of 0.2 u or less and then poured onto a suitable substrate set on a spinner. As the substrate, there may be used known ones, for example, a glass plate with chromium or chromium oxide vapor-coated thereon, on a silicon wafer. By rotating the spinner at 500 to 10,000 rpm, a uniform coating is formed on the substrate. The coating is pre-baked to remove solvent and enhance adhesion. The pre-baking is usually carried out at a temperature of 50° to 120° C. in a vacuum/$N_2$ oven for a period of 5 to 30 minutes. Equivalent results are obtained by pre-baking on a hot chuck in a $N_2$-atmosphere; the conditions for pre-baking should be selected between 90°-110° C. or such that the solvent is removed and the polymer does not undergo crosslinking.

In electron beam exposure, electron beams of 10 to 30 KeV may be used, with the amount of electricity ranging from $4 \times 10^{-8}$ to $5 \times 10^{-6}$ coulomb/cm$^2$, which may be selected according to the sensitivity of the polymer. Usually, the amount of electricity is selected so that half of the coating thickness is left after development.

After exposure, development is carried out in a suitable solvent by the conventional manner or spray development technique. Any developing solvents may be used with the only requirement, that they dissolve the polymer used, but if any solvent cause the unsolubilized portion to swell too much, they should be avoided. For the silyl group containing polymer of the instant invention methylsiobutylketone has been found suitable.

After development and rinsing, the resist pattern formed is post-baked to improve adhesion to the substrate. Post-baking, usually is conducted at 60° to 200° C. for 5 minutes to 1 hour. This baking step may be carried out in vacuum or in an inert gas such as nitrogen or argon.

EXAMPLE I

Trimethylsilylstyrene Synthesis

Magnesium turnings (2.6 grams; 0.11 mole) is placed in a 500 ml, 3-neck flask, filtered with an additional funnel, condenser and nitrogen gas purge. Tetrohydrofuran (200 ml) was added with a pinch of iodine crystals. A few drops of bromochloroethane was added to the flask until the iodine color disappeared.

The magnesium metal is activated when the iodine color has disappeared. A solution of chlorotrimethylsilane (3.0 ml, 0.1 mole) in 180 ml tetrahydrofuran was added to the reaction vessel. 4-chlorostyrene (13.9 gm., 0.1 mole) was added dropwise with vigorous stirring to the reaction mixture. The reaction was exothermic. When the magnesium metal was totally consumed, 200 ml. of water was added slowly, followed by 200 ml. of diethylether. The layers separated, the organic layer was recovered, dried over anhydrous magnesium sulfate and the organic solvent stripped. The resulting material, the title compound was analyzed by gas chromotography. There was obtained 63–68% yield with a 95–98% purity.

This reaction can also be carried out with 4-bromostyrene (mol. wt. 183.0 g) in place of the 4-chlorostyrene.

Preparation of
Poly-trimethylsilylstyrene-copolymer-chloromethylstyrene, Free Radical Polymerization Trimethylsilylstyrene and chloromethylstyrene (of varying ratios depending upon the desired copolymer characteristics) were charged in a round bottom flask and dissolved in toluene. The solution was purged with nitrogen gas. The free radical initiator, azobisisobutyronitrile was added. The solution was refluxed over a range of 24–72 hours. Aliquots of additional initiator were added as the reflux continued. After 72 hours, 7.5 mg. of the initiator had been added the copolymer yield had reached 85%.

The toluene was evaporated and the liquid (viscous) residue was dissolved in ethylacetate. This solution was then added dropwise into methanol with stirring. The mixture was stirred for 2 hours and the polymer was filtered off and rinsed with more portions of methanol. The resulting powder was air dried and then dried in a 65° vacuum oven for 3–4 hours.

EXAMPLE 2

In a E-beam exposure, electron beams of 10–30 KeV may be used, with the amount of electricity ranging from $4 \times 8^{-10}$ to doses between 2–20 coulomb/cm$^{-2}$. Development of the exposed material was carried out as follows:

(1) methylisobutylketone: isopropyl alchol of ratios 100:0, 80:0, 70:0, 60:0 for 20 seconds;
(2) methyisobutylketone 50:50 for 5 seconds;
(3) Isopropyl alcohol rinse for 15 seconds.

The sensitivity characteristics were: 3–4 coulomb/cm$^{-2}$ and contrast=2.3–2.9.

EXAMPLE 3

In X-ray exposure, the Stanford Synchrotron Radiation Laboratory beam line III-4 at Stanford University was used. The beam width was 0.30 mm and length was 5.90 mm. The spectrum of the beam used had an energy (eV) maximum at 1000 and 2000 at $0.040 \times 10^{-13}$ flux. See the following graph of thickness remaining (Angstroms) versus log dose (mj/cm$^2$).

The polymer proved to have the following sensitivity characteristics: 138–140 m/cm$^2$ contrast=2.6–2.8.

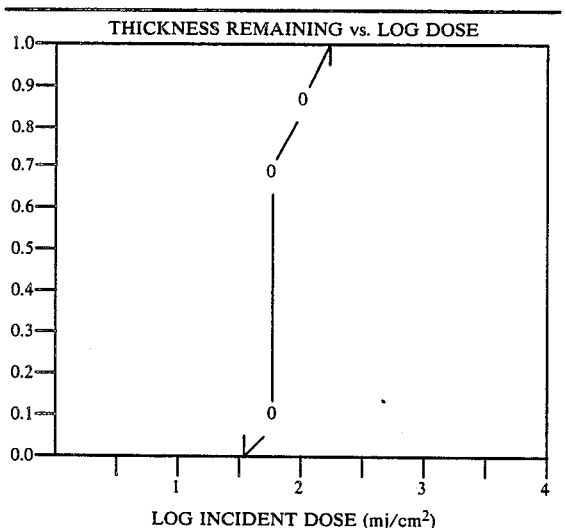

THICKNESS REMAINING vs. LOG DOSE
LOG INCIDENT DOSE (mj/cm$^2$)

It will be apparent to those skilled in this art that the surfaces and treatments thereof may readily be caused to exist only on selected areas of the surface of a suitable substrate. Also intricate detailing in the shape of areas is possible using techniques known in the graphic arts and related technologies. Patterning may also be arranged to be accomplished by exposure of selected areas of a uniformly coated surface to irradiation, whereupon photochemical reactions occur selectively either to produce, as is the usual case, bonding by crosslinking where previously absent. Thereby the surface treatment with irradiation produces a resist which is resilient to plasmas and has reduced erosion effect.

Various modifications, alterations and adaptions of the teachings of the present disclosure may be made without departing from the spirit and scope of the present invention as defined by the following claims.

What is claimed is:

1. A resist material capable of forming a negative image by application of radiation, said material comprising an silyl-containing styrene copolymer.
2. The resist material as defined in claim 1, in which said polymer contains at least about 5 percent copolymerized chloromethylstyrene the remainder in polytrimethylsilylstyrene.
3. The resist material as defined in claim 1, in which the average molecular weight of said copolymer is at least 2000.
4. A lithographic process for preparing a pattern resist on a suitable substrate, which process comprises:
    (1) applying a layer of resist material onto a substrate, said polymer being selected from the group consisting of allylsilyl-containing styrene copolymers with halogenated methylstyrene,
    (2) irradiating said resist copolymer layer to form a negative pattern image therein; and
    (3) developing said image by:
        (i) dissolving away unexposed polymer with a suitable developer solvent, and
        (ii) rinsing said wet developed resist with suitable solvent to maintain well-defined developed resist pattern image; and
    (4) etching the resist material in a suitable plasma.
5. The process of claim 4 in which said resist polymer is a copolymer of alkylsilylsubstituted styrene and halomethylstyrene having an average molecular weight of more than 2000.
6. The process of claim 4 in which said resist polymer is a copolymer of trimethylsilylstyrene and chloromethylstyrene.
7. The process of claim 6 wherein the developer/rinse is methylisobutylketone and isopropyl alcohol.
8. Negative resist compositions consisting essentially of styrene copolymers having silyl containing styrene monomers.
9. The composition of claim 8 in which said copolymer is selected from a copolymer prepared from the monomers of alkylsilyl substituted styrene and halomethylstyrene.
10. The composition of claim 9 wherein said compolymers are prepared from the monomers trimethylsilylstyrene and chloromethylstyrene.
11. The composition of claim 9 in which the average molecular weight of said copolymer is between about 2000 and about 1000000.
12. The composition of claim 9 in which the chloromethylstyrene monomer contains about five percent chlorine.
13. In the process of claim 4 in which said suitable substrate consists of a glass plate with chromium or chromium oxide vaporcoated thereon.
14. A semiconductor wafer having deposited on its surface photoresist, molecules of which contain copolymers prepared from monomers of alkylsilyl-substituted-styrene and halomethylstyrene.
15. A semiconductor wafer as claimed in claim 14 in which between the photoresist and the substrate there is a silicon containing polystyrene copolymer.
16. A semiconductor wafer as claimed in claim 15 in which said polystyrene copolymer essentially consists of trimethylsilylstyrene and chloromethylstyrene.
17. A semiconductor wafer as claimed in claim 14 wherein said photoresist comprises a silicon-containing polystyrene resin consisting of an alkylsilyl-substituted-styrene and halomethylstyrene.
18. A device made from a semiconductor wafer as claimed in claim 17.

* * * * *